(12) United States Patent
Wang et al.

(10) Patent No.: US 9,741,898 B2
(45) Date of Patent: Aug. 22, 2017

(54) SEMICONDUCTOR LIGHT EMITTING DEVICE

(71) Applicant: PlayNitride Inc., Tainan (TW)

(72) Inventors: Shen-Jie Wang, Tainan (TW); Yu-Chu Li, Tainan (TW); Ching-Liang Lin, Tainan (TW)

(73) Assignee: PlayNitride Inc., Tainan (TW)

(*) Notice: Subject to any disclaimer, the term of this patent is extended or adjusted under 35 U.S.C. 154(b) by 0 days.

(21) Appl. No.: 15/175,789

(22) Filed: Jun. 7, 2016

(65) Prior Publication Data

US 2017/0141262 A1 May 18, 2017

(30) Foreign Application Priority Data

Nov. 12, 2015 (TW) .............................. 104137255 A

(51) Int. Cl.
| | |
|---|---|
| *H01L 29/06* | (2006.01) |
| *H01L 31/00* | (2006.01) |
| *H01L 33/12* | (2010.01) |
| *H01L 33/04* | (2010.01) |
| *H01L 33/32* | (2010.01) |

(52) U.S. Cl.
CPC .............. *H01L 33/12* (2013.01); *H01L 33/04* (2013.01); *H01L 33/32* (2013.01)

(58) Field of Classification Search
USPC ......... 257/81, 82, 91, 98, 99, 100, 116, 117, 257/432–437, 749, E33.056–E33.059, 257/E25.032; 438/25–28
See application file for complete search history.

(56) References Cited

U.S. PATENT DOCUMENTS

| | | | |
|---|---|---|---|
| 2014/0077152 A1* | 3/2014 | Li | ........................... H01L 33/32 257/13 |
| 2014/0264265 A1* | 9/2014 | Arena | .................... H01L 33/007 257/13 |

* cited by examiner

*Primary Examiner* — Tram H Nguyen
(74) *Attorney, Agent, or Firm* — J.C. Patents

(57) ABSTRACT

A semiconductor light emitting device including an N-type semiconductor layer, a P-type semiconductor layer, a light emitting layer and a strain relief layer is provided. The light emitting layer is disposed between the N-type semiconductor layer and the P-type semiconductor layer, and the light emitting layer is a multiple quantum well structure. The strain relief layer is disposed between the light emitting layer and the N-type semiconductor layer, and is made of $In_xGa_{1-x}N$, where $0<x<1$. The difference between any two values of x corresponded to any two positions in the strain relief layer is greater than −0.01 and less than 0.01. The thickness of the strain relief layer is larger than the thickness of each well layer of the multiple quantum well structure.

10 Claims, 2 Drawing Sheets

SEMICONDUCTOR LIGHT EMITTING DEVICE

CROSS-REFERENCE TO RELATED APPLICATION

This application claims the priority benefit of Taiwan application serial no. 104137255, filed on Nov. 12, 2015. The entirety of the above-mentioned patent application is hereby incorporated by reference herein and made a part of this specification.

BACKGROUND OF THE INVENTION

1. Field of the Invention

The invention is related to a light emitting device and more particularly to a semiconductor light emitting device.

2. Description of Related Art

With the evolution of photoelectrical technology, traditional incandescent bulbs and fluorescent lamps have been gradually replaced by solid-state light sources of the new generation, such as light-emitting diodes (LEDs). The LEDs have advantages, such as long lifespans, small sizes, high shock resistance, high light efficiency and low power consumption and thus, have been widely adopted as light sources in applications including household lighting appliances as well as various types of equipment. Beside being widely adopted in light sources of backlight modules of liquid crystal displays (LCDs) and household lighting appliances, the application of the LEDs have been expanded to street lighting, large outdoor billboards, traffic lights, ultraviolet (UV) curing and the related fields in recent years. As a result, the LEDs have been developed as the light sources featuring economic power consumption and environmental protection.

In a typical light emitting diode chip, in order to achieve a strain relief effect of stacked layers of semiconductor, a strain relief layer of a super lattice structure may be employed between the N-type semiconductor layer and the light emitting layer, and the so-called super lattice structure is, for example, formed by employing layers with two different materials alternately stacked. Such implementation has become a generally customary method for people of ordinary skill in the art, and the conventional technology is failed to achieve a breakthrough on this point.

SUMMARY OF THE INVENTION

The invention provides a semiconductor light emitting device having a relatively simple structure.

In one exemplary embodiment of the invention, a semiconductor light emitting device including an N-type semiconductor layer, a P-type semiconductor layer, a light emitting layer and a strain relief layer is provided. The light emitting layer is disposed between the N-type semiconductor layer and the P-type semiconductor layer, wherein the light emitting layer is a multiple quantum well structure. The strain relief layer is disposed between the light emitting layer and the N-type semiconductor layer, and is made of $In_xGa_{1-x}N$, wherein $0<x<1$. The difference between any two values of x corresponded to any two positions in the strain relief layer is greater than −0.01 and less than 0.01, and the thickness of the strain relief layer is larger than the thickness of each well layer of the multiple quantum well structure.

According to one exemplary embodiment of the invention, the thickness of the strain relief layer is 10 to 100 times the thickness of each well layer of the multiple quantum well structure.

In one exemplary embodiment of the invention, a semiconductor light emitting device including an N-type semiconductor layer, a P-type semiconductor layer, a light emitting layer and a strain relief layer is provided. The light emitting layer is disposed between the N-type semiconductor layer and the P-type semiconductor layer, wherein the light emitting layer is a multiple quantum well structure. The strain relief layer is disposed between the light emitting layer and the N-type semiconductor layer, and the thickness of the strain relief layer is 10 to 100 times the thickness of any one of the well layers of the multiple quantum well structure.

According to one exemplary embodiment of the invention, the indium content of the strain relief layer is lower than the indium content of each well layer of the multiple quantum well structure.

According to one exemplary embodiment of the invention, each well layer of the multiple quantum well structure is made of $In_yGa_{1-y}N$, wherein $0<y<1$, and $0.05 \leq y-x \leq 0.25$.

According to one exemplary embodiment of the invention, the thickness of the barrier layer that is the most adjacent to the N-type semiconductor layer in the multiple quantum well structure is larger than the thickness of the barrier layer that is the most adjacent to the P-type semiconductor layer in the multiple quantum well structure.

According to one exemplary embodiment of the invention, the thickness of the strain relief layer is 5 to 50 times the thickness of the barrier layer that is the most adjacent to the N-type semiconductor layer in the multiple quantum well structure.

According to one exemplary embodiment of the invention, the thickness of the strain relief layer is larger than the total thickness of the multiple quantum well structure.

According to one exemplary embodiment of the invention, the thickness of the strain relief layer is 1.1 to 3 times the thickness of the multiple quantum well structure.

According to one exemplary embodiment of the invention, the strain relief layer contains an N-type dopant, and the concentration of the N-type dopant of the strain relief layer is lower than the concentration of the N-type dopant of the N-type semiconductor layer.

According to one exemplary embodiment of the invention, each well layer of the multiple quantum well structure is made of indium gallium nitride, and each barrier layer of the multiple quantum well structure is made of gallium nitride.

In the semiconductor light emitting device of the embodiment of the invention, since a strain relief layer having a single layer structure is employed and the thickness thereof is larger than the thickness of the well layer of the multiple quantum well structure, thereby the structure of the semiconductor light emitting device is comparatively simple, as well as maintaining a good production yield.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
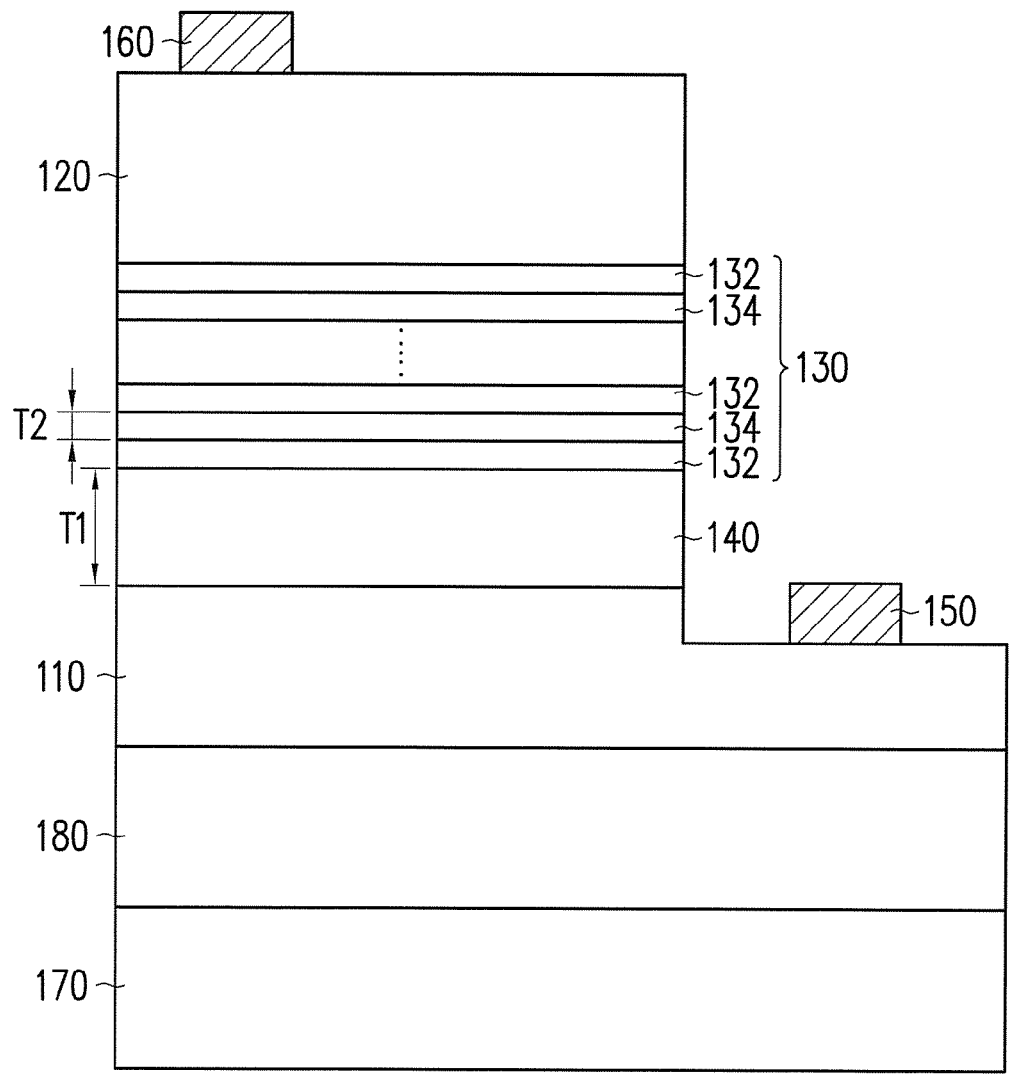
FIG. 1 is a schematic cross-sectional view of a semiconductor light emitting device according to an exemplary embodiment of the invention.

The interpretation of terms and words described in the specification and the attached claims should not be limited to the typical meaning or dictionary definition, however should be based on the concept of the inventors suitably defining the terminology to describe what he or she knows to implement the principles of the invention, and explain the meaning and concepts of the scope of related technologies of the invention. Therefore, configuration described in the embodiments and the drawings of the invention are merely illustrative examples of the implementation of the embodiments, it does not represent the full spirit of the techniques of the invention. Thus, the invention should be constructed as including all changes, equalization and replacement at the time point of filing this application, which is included in the spirit and the scope of the invention.

Hereinafter, embodiments of the invention will be described in detail with the accompanying drawings. It is noted that some components shown in the drawings is exaggerated, omitted, or illustrated, and the dimension of each component does not fully reflect its actual dimension.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a semiconductor light emitting device according to an exemplary embodiment of the invention. Referring to FIG. 1, in the present embodiment, the semiconductor light emitting device 100 includes an N-type semiconductor layer 110, a P-type semiconductor layer 120, a light emitting layer 130 and a strain relief layer 140. The light emitting layer 130 is disposed between the N-type semiconductor layer 110 and the P-type semiconductor layer 120, wherein the light emitting layer 130 is a multiple quantum well structure. The strain relief layer 140 is disposed between the light emitting layer 130 and the N-type semiconductor layer 110, and made of $In_xGa_{1-x}N$ (i.e., indium gallium nitride), wherein 0<x<1.

In the present embodiment, the difference between any two values of x corresponded to any two positions in the strain relief layer 140 is greater than −0.01 and less than 0.01. In other words, the content of indium and gallium in the strain relief layer 140 is comparatively even, thus the strain relief layer 140 can be regarded as a single layer. In addition, in the present embodiment, the thickness T1 of the strain relief layer 140 is larger than the thickness T2 of each well layer 134 of the multiple quantum well structure. In the present embodiment, the strain relief layer 140 is adapted to release the strain accumulated during the growth of the N-type semiconductor layer 110, thus making the epitaxial quality of the light emitting layer 130 which grows above the strain relief layer 140 better.

In the semiconductor light emitting device 100 of the embodiment of the invention, since a strain relief layer 140 having a single layer structure is employed and its thickness T1 is larger than the thickness T2 of the well layer 134 of the multiple quantum well structure, thereby the structure of the semiconductor light emitting device 100 is comparatively simple, as well as maintaining a good production yield.

In the present embodiment, the multiple quantum well structure which composes the light emitting layer 130 includes a plurality of barrier layers 132 and a plurality of well layers 134 which are alternately stacked. In addition, in the present embodiment, the thickness T1 of the strain relief layer 140 is 10 to 100 (e.g., 70) times the thickness T2 of each well layer 134 of the multiple quantum well structure. When the thickness T1 is smaller than 10 times the thickness T2, the strain relief effect may be poor, thereby resulting that the carrier confinement of the follow-up grown well layers 134 may be poor, and light emission efficiency may be affected. When the thickness T1 is larger than 100 times the thickness T2, the overall thickness of the semiconductor light emitting device 100 is increased, and light absorbing phenomenon may be generated and light emission efficiency may be affected. Therefore, in the present embodiment, the design that the thickness T1 is 10 to 100 times the thickness T2 may make the semiconductor light emitting device 100 have a good light emission efficiency.

In the present embodiment, each well layer 134 of the multiple quantum well structure is made of indium gallium nitride, and each barrier layer 132 of the multiple quantum well structure is made of gallium nitride, however the invention is not limited thereto. In the present embodiment, the indium content of the strain relief layer 140 is lower than the indium content of each well layer 134 of the multiple quantum well structure. The excessive indium content of the strain relief layer 140 would cause increase of the internal stress, destruction of the crystal structure, and increase the number of crystal defects, thereby affecting the light output, and generating excess heat, therefore the indium content of the strain relief layer 140 may be designed to be lower than the indium content of the well layer 134. Specifically, in the present embodiment, each well layer 134 of the multiple quantum well structure is made of $In_yGa_{1-y}N$, wherein 0<y<1, and 0.05≤y−x≤0.25, wherein x is the abovementioned x value of the material of the strain relief layer 140. In one embodiment, 0.05≤x≤0.35, and 0.1≤y≤0.6.

In the embodiment, the thickness of the barrier layer 132 that is the most adjacent to the N-type semiconductor layer 110 in the multiple quantum well structure is larger than the thickness of the barrier layer 132 that is the most adjacent to the P-type semiconductor layer 120 in the multiple quantum well structure. Since the thickness of the N-type semiconductor layer 110 is larger than the thickness of the P-type semiconductor layer 120 in this embodiment, the stress accumulated at the side (N-side) of the N-type semiconductor layer 110 is more, in the present embodiment it is implemented that the thickness of the barrier layer 132 which is adjacent to the N-type semiconductor layer 110 is designed to be larger than the thickness of the barrier layer 132 which is adjacent to the P-type semiconductor layer 120, thereby a carrier current confinement may be achieved.

In the present embodiment, the thickness T1 of the strain relief layer 140 is 5 to 50 times the thickness of the barrier layer 132 that is the most adjacent to the N-type semiconductor layer 110 in the multiple quantum well structure. Since the barrier layer 132 that is the most adjacent to the N-type semiconductor layer 110 is directly in contact with the strain relief layer 140, the barrier layer 132 that is the most adjacent to the N-type semiconductor layer 110 and the strain relief layer 140 have a relative relationship of thickness therebetween. When the thickness T1 is smaller than 5 times the thickness of the barrier layer 132 that is the most adjacent to the N-type semiconductor layer 110 in the multiple quantum well structure, the strain relief effect may be poor, thereby causing the film forming ability of the follow-up grown well layers 134 poor. When the thickness T1 is larger than 50 times the thickness of the barrier layer 132 that is the most adjacent to the N-type semiconductor layer 110 in the multiple quantum well structure, the overall thickness of the semiconductor light emitting device 100 is increased, and light absorbing phenomenon may be generated and light emission efficiency may be affected.

In the present embodiment, the thickness T1 of the strain relief layer 140 is larger than the total thickness of the multiple quantum well structure. In the present embodiment, the thickness T1 of the strain relief layer 140 is 1.1 to 3 times the thickness of the multiple quantum well structure. When the thickness T1 is smaller than 1.1 times the thickness of the multiple quantum well structure, the strain relief effect may be poor, thereby causing the film forming ability of the follow-up grown light emitting layer poor. When the thickness T1 is larger than 3 times the thickness of the multiple quantum well structure, the overall thickness of the semiconductor light emitting device 100 is increased, and light absorbing phenomenon may be generated and light emission efficiency may be affected.

In the present embodiment, the strain relief layer 140 contains an N-type dopant, and the concentration of the N-type dopant of the strain relief layer 140 is lower than the concentration of the N-type dopant of the N-type semiconductor layer 110. Since the N-type dopant would damage the crystal structure, increase the number of crystal defects and generate excess heat, in order to have a better strain relief ability, the concentration of the N-type dopant of the strain relief layer 140 may be smaller than the concentration of the N-type dopant of the N-type semiconductor layer 110.

In the present embodiment, the material of the N-type semiconductor layer 110 may include an N-type Group III-V nitride material (e.g., N-type gallium nitride (GaN), N-type aluminum nitride (AlN), N-type indium nitride (InN), N-type indium gallium nitride (InGaN), N-type aluminum gallium nitride (AlGaN) or N-type aluminum indium gallium nitride (AlInGaN), preferably N-type gallium nitride layer (n-GaN) or N-type aluminum gallium nitride (AlGaN)). The material of the P-type semiconductor layer 120 may include a P-type Group III-V nitride material (e.g., P-type gallium nitride (GaN), P-type aluminum nitride (AlN), P-type indium nitride (InN), P-type indium gallium nitride (InGaN), P-type aluminum gallium nitride (AlGaN) or P-type aluminum indium gallium nitride (AlInGaN), preferably P-type gallium nitride layer (GaN) or P-type aluminum gallium nitride (AlGaN)), but the invention is not limited thereto.

In the present embodiment, the semiconductor light emitting device 100 further includes a substrate 170, a non-intentionally doped gallium nitride layer 180, a first electrode 150 and the second electrode 160. The non-intentionally doped gallium nitride layer 180 is formed on the substrate 170, and the N-type semiconductor layer 110, the strain relief layer 140, the light emitting layer 130 and the P-type semiconductor layer 120 are sequentially formed thereupon. In addition, the first electrode 150 is formed on the N-type semiconductor layer 110 and electrically connected to the N-type semiconductor layer 110. The second electrode 160 is formed on the P-type semiconductor layer 120 and electrically connected to the P-type semiconductor layer 120. In the present embodiment, the material of the substrate 170 is, for example, sapphire, silicon, silicon carbide (SiC), glass, ceramics, or any other materials having crystal structure that matches the non-intentionally doped gallium nitride layer 180, preferably a sapphire substrate, but the invention is not limited thereto.

The semiconductor light emitting device 100 of the present embodiment is, for example, a horizontal type light emitting diode in which both of the first electrode 150 and the second electrode 160 are located on the same side of the semiconductor light emitting device 100.

Figure 2:
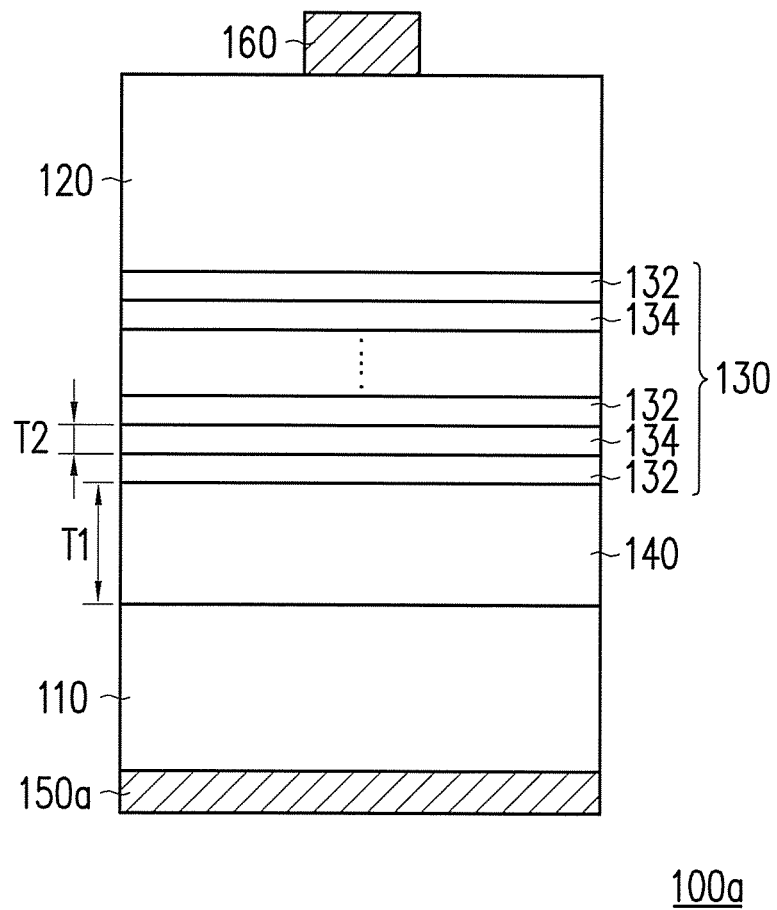
FIG. 2 is a schematic cross-sectional view of a semiconductor light emitting device according to another exemplary embodiment of the invention.

FIG. 2 is a schematic cross-sectional view of a semiconductor light emitting device according to another exemplary embodiment of the invention. Referring to FIG. 2, the semiconductor light emitting device 100a is similar to the semiconductor light emitting device 100 of FIG. 1, and the difference therebetween is that the semiconductor light emitting device 100a of the present embodiment is, for example, a vertical type light emitting diode in which the first electrode 150a and the second electrode 160 are respectively located on the two opposite sides of the semiconductor light emitting element 100a. Specifically, the first electrode 150a may be a conductive layer disposed below the N-type semiconductor layer 110, and electrically connected to the N-type semiconductor layer 110. In the present embodiment, the first electrode 150a is directly disposed on the lower surface of the N-type semiconductor layer 110, however in other embodiments, the first electrode 150a and the N-type semiconductor layer 110 may also be connected through a conductive substrate.

In light of the foregoing, in the semiconductor light emitting device of the embodiment of the invention, since a strain relief layer having a single layer structure is employed and the thickness thereof is larger than the thickness of the well layer of the multiple quantum well structure, thereby the structure of the semiconductor light emitting device is comparatively simple, as well as maintaining a good production yield.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor light emitting device, comprising:
   an N-type semiconductor layer;
   a P-type semiconductor layer;
   a light emitting layer, disposed between the N-type semiconductor layer and the P-type semiconductor layer, wherein the light emitting layer is a multiple quantum well structure; and
   a strain relief layer, disposed between the light emitting layer and the N-type semiconductor layer, and made of $In_xGa_{1-x}N$, wherein $0<x<1$, a difference between any two values of x corresponded to any two positions in the strain relief layer is greater than $-0.01$ and less than $0.01$, and a thickness of the strain relief layer is larger than a thickness of each well layer of the multiple quantum well structure.

2. The semiconductor light emitting device as claimed in claim 1, wherein the thickness of the strain relief layer is 10 to 100 times the thickness of each well layer of the multiple quantum well structure.

3. The semiconductor light emitting device as claimed in claim 1, wherein an indium content of the strain relief layer is lower than an indium content of each well layer of the multiple quantum well structure.

4. The semiconductor light emitting device as claimed in claim 3, wherein each well layer of the multiple quantum well structure is made of $In_yGa_{1-y}N$, wherein $0<y<1$, and $0.05 \leq y-x \leq 0.25$.

5. The semiconductor light emitting device as claimed in claim 1, wherein a thickness of a barrier layer that is the most adjacent to the N-type semiconductor layer in the multiple quantum well structure is larger than a thickness of a barrier layer that is the most adjacent to the P-type semiconductor layer in the multiple quantum well structure.

6. The semiconductor light emitting device as claimed in claim 1, wherein the thickness of the strain relief layer is 5 to 50 times a thickness of a barrier layer that is the most adjacent to the N-type semiconductor layer in the multiple quantum well structure.

7. The semiconductor light emitting device as claimed in claim 1, wherein the thickness of the strain relief layer is larger than a total thickness of the multiple quantum well structure.

8. The semiconductor light emitting device as claimed in claim 7, wherein the thickness of the strain relief layer is 1.1 to 3 times a thickness of the multiple quantum well structure.

9. The semiconductor light emitting device as claimed in claim 1, wherein the strain relief layer contains an N-type dopant, and a concentration of the N-type dopant of the strain relief layer is lower than a concentration of an N-type dopant of the N-type semiconductor layer.

10. The semiconductor light emitting device as claimed in claim 1, wherein each well layer of the multiple quantum well structure is made of indium gallium nitride, and each barrier layer of the multiple quantum well structure is made of gallium nitride.

* * * * *